(12) United States Patent
Kim et al.

(10) Patent No.: US 11,695,390 B2
(45) Date of Patent: *Jul. 4, 2023

(54) BAW RESONATORS WITH ANTISYMMETRIC THICK ELECTRODES

(71) Applicant: Akoustis, Inc., Huntersville, NC (US)

(72) Inventors: Dae Ho Kim, Cornelius, NC (US); Mary Winters, Webster, NY (US); Zhiqiang Bi, Mooresville, NC (US)

(73) Assignee: Akoustis, Inc., Huntersville, NC (US)

( * ) Notice: Subject to any disclaimer, the term of this patent is extended or adjusted under 35 U.S.C. 154(b) by 234 days.

This patent is subject to a terminal disclaimer.

(21) Appl. No.: 17/130,915

(22) Filed: Dec. 22, 2020

(65) Prior Publication Data
US 2021/0111700 A1   Apr. 15, 2021

Related U.S. Application Data

(63) Continuation of application No. 16/389,806, filed on Apr. 19, 2019, now Pat. No. 10,879,872.

(51) Int. Cl.
*H03H 9/13* (2006.01)
*H03H 9/02* (2006.01)
(Continued)

(52) U.S. Cl.
CPC ........ *H03H 9/132* (2013.01); *H03H 9/02015* (2013.01); *H03H 9/02157* (2013.01);
(Continued)

(58) Field of Classification Search
CPC ............... H03H 9/132; H03H 9/02015; H03H 9/02157; H03H 9/131; H03H 9/171;
(Continued)

(56) References Cited

U.S. PATENT DOCUMENTS 10,879,872 B2 * 12/2020 Kim ................... H03H 9/02118
2004/0012310 A1   1/2004 Katakura et al.
(Continued)

FOREIGN PATENT DOCUMENTS

EP   1533896 B1   11/2011

OTHER PUBLICATIONS

Search Report and Written Opinion dated Jul. 24, 2020 for PCT Application No. PCT/US2020/028285.

*Primary Examiner* — Rakesh B Patel
*Assistant Examiner* — Jorge L Salazar, Jr.
(74) *Attorney, Agent, or Firm* — Richard T. Ogawa; Ogawa P.C.

(57) ABSTRACT

A resonator circuit device. This device can include a piezoelectric layer having a front-side electrode and a back-side electrode spatially configured on opposite sides of the piezoelectric layer. Each electrode has a connection region and a resonator region. Each electrode also includes a partial mass-loaded structure configured within a vicinity of its connection region. The front-side electrode and the back-side electrode are spatially configured in an anti-symmetrical manner with the resonator regions of both electrodes at least partially overlapping and the first and second connection regions on opposing sides. This configuration provides a symmetric acoustic impedance profile for improved Q factor and can reduce the issues of misalignment or unbalanced boundary conditions associated with conventional single mass-loaded perimeter configurations.

20 Claims, 10 Drawing Sheets

(51) Int. Cl.
 *H03H 9/54* (2006.01)
 *H03H 9/17* (2006.01)
(52) U.S. Cl.
 CPC .......... *H03H 9/131* (2013.01); *H03H 9/171* (2013.01); *H03H 9/547* (2013.01)
(58) Field of Classification Search
 CPC .. H03H 9/547; H03H 9/02118; H03H 9/0533; H03H 9/174
 USPC ........................................ 333/186, 187, 188
 See application file for complete search history.

(56) References Cited

U.S. PATENT DOCUMENTS

| | | |
|---|---|---|
| 2008/0143215 A1 | 6/2008 | Hara et al. |
| 2010/0109809 A1 | 5/2010 | Tanaka et al. |
| 2011/0085684 A1 | 4/2011 | Kim et al. |
| 2014/0118088 A1* | 5/2014 | Burak ................ H03H 9/02118 333/187 |

* cited by examiner

BAW RESONATORS WITH ANTISYMMETRIC THICK ELECTRODES

CROSS REFERENCE TO RELATED APPLICATION

This application is a continuation of and claims priority to U.S. patent application Ser. No. 16/389,806 filed Apr. 19, 2019, and issued as U.S. Pat. No. 10,879,872 on Dec. 29, 2020, the contents of which are incorporated herein by reference in their entirety.

BACKGROUND OF THE INVENTION

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

With 4G LTE and 5G growing more popular by the day, wireless data communication demands high performance RF filters with frequencies around 5 GHz and higher. Bulk acoustic wave resonators (BAWR) using crystalline piezoelectric thin films are leading candidates for meeting such demands. Current BAWRs using polycrystalline piezoelectric thin films are adequate for bulk acoustic wave (BAW) filters operating at frequencies ranging from 1 to 3 GHz; however, the quality of the polycrystalline piezoelectric films degrades quickly as the thicknesses decrease below around 0.5 um, which is required for resonators and filters operating at frequencies around 5 GHz and above. Single crystalline or epitaxial piezoelectric thin films grown on compatible crystalline substrates exhibit good crystalline quality and high piezoelectric performance even down to very thin thicknesses, e.g., 0.4 um. Even so, there are challenges to using and transferring single crystal piezoelectric thin films in the manufacture of BAWR and BAW filters.

From the above, it is seen that techniques for improving methods of manufacture and structures for acoustic resonator devices are highly desirable.

BRIEF SUMMARY OF THE INVENTION

According to the present invention, techniques generally related to electronic devices are provided. More particularly, the present invention provides techniques related to a method of manufacture and structure for bulk acoustic wave (BAW) resonator devices, single crystal resonator devices, single crystal filter and resonator devices, and the like. Merely by way of example, the invention has been applied to a single crystal resonator device for a communication device, mobile device, computing device, among others.

In an example, the present invention includes a resonator device and associated method for improving Q factor using an anti-symmetrical configuration. The device can include a piezoelectric layer having a front-side electrode and a back-side electrode spatially configured on opposite sides of the piezoelectric layer. Each electrode has a connection region and a resonator region. Each electrode also includes a partial mass-loaded structure configured within a vicinity of its connection region. The front-side electrode and the back-side electrode are spatially configured in an anti-symmetrical manner with the resonator regions of both electrodes at least partially overlapping and the first and second connection regions on opposing sides.

In an example, the front-side and back-side electrodes can include molybdenum (Mo), ruthenium (Ru), tungsten (W), aluminum-copper (AlCu), or other like materials. The partial-mass loaded structures can also include molybdenum (Mo), ruthenium (Ru), tungsten (W), aluminum-copper (AlCu), or other like materials. The partial-mass loaded structure is formed as part of the electrode or separate materials in the fabrication process. Further, the piezoelectric layer can include materials or alloys having at least one of MN, AlGaN, GaN, ScAlN, $LiNbO_3$, $LiTaO_3$, $Ba(Sr,Ti)O_3$, and $Pb(Zr,Ti)O_3$, or the like.

In a specific example, the front-side and back-side electrodes are spatially configured such that a portion of the front-side electrode partial mass-loaded structure overlaps a portion of the back-side electrode resonator region. Similarly, a portion of the back-side electrode partial mass-loaded structure is overlapped by a portion of the front-side electrode resonator region. Also, these mass-loaded structures can be configured up to around half of the perimeter of the electrodes from the connection region side. Those of ordinary skill in the art will recognize other variations, modifications, and alternatives.

One or more benefits are achieved over pre-existing techniques using the present invention. In particular, the present invention also provides for an improved anti-symmetrical BAW resonator device and method. The anti-symmetric configuration provides a symmetric acoustic impedance profile for improved Q factor and can reduce the issues of misalignment or unbalanced boundary conditions associated with conventional single mass-loaded perimeter configurations. This configuration also provides lower electrical resistance for improved Q factor around the resonance frequency. Also, the present invention is compatible with arbitrary resonator shapes. Further, the present device can be manufactured in a relatively simple and cost effective manner while using conventional materials and/or methods according to one of ordinary skill in the art. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

According to the present invention, techniques generally related to electronic devices are provided. More particularly, the present invention provides techniques related to a method of manufacture and structure for bulk acoustic wave (BAW) resonator devices, single crystal resonator devices, single crystal filter and resonator devices, and the like. Merely by way of example, the invention has been applied to a single crystal resonator device for a communication device, mobile device, computing device, among others.

Generally, a BAW resonator is a parallel plate capacitor which can be characterized by the geometrical shape of its metal plates and the thickness and composition of the piezoelectric material between the two electrodes of the capacitor. A configuration of such resonators can be used to create an RF filter creating a signal passband that is characterized by the insertion loss (known as "S21"), which describes the impact of placing the filter in an RF circuit.

In BAW resonators, improving quality (Q) factor at resonance frequency is critical. Larger mass load structures are typically configured along the perimeter of an electrode structure to enhance Q by limiting the dissipation of the acoustic waves. However, due to necessity and limited process ability, such mass load structures are used only on one electrode in an electrode pair. This configuration is shown in FIGS. 1A and 1B.

Figure 1A:
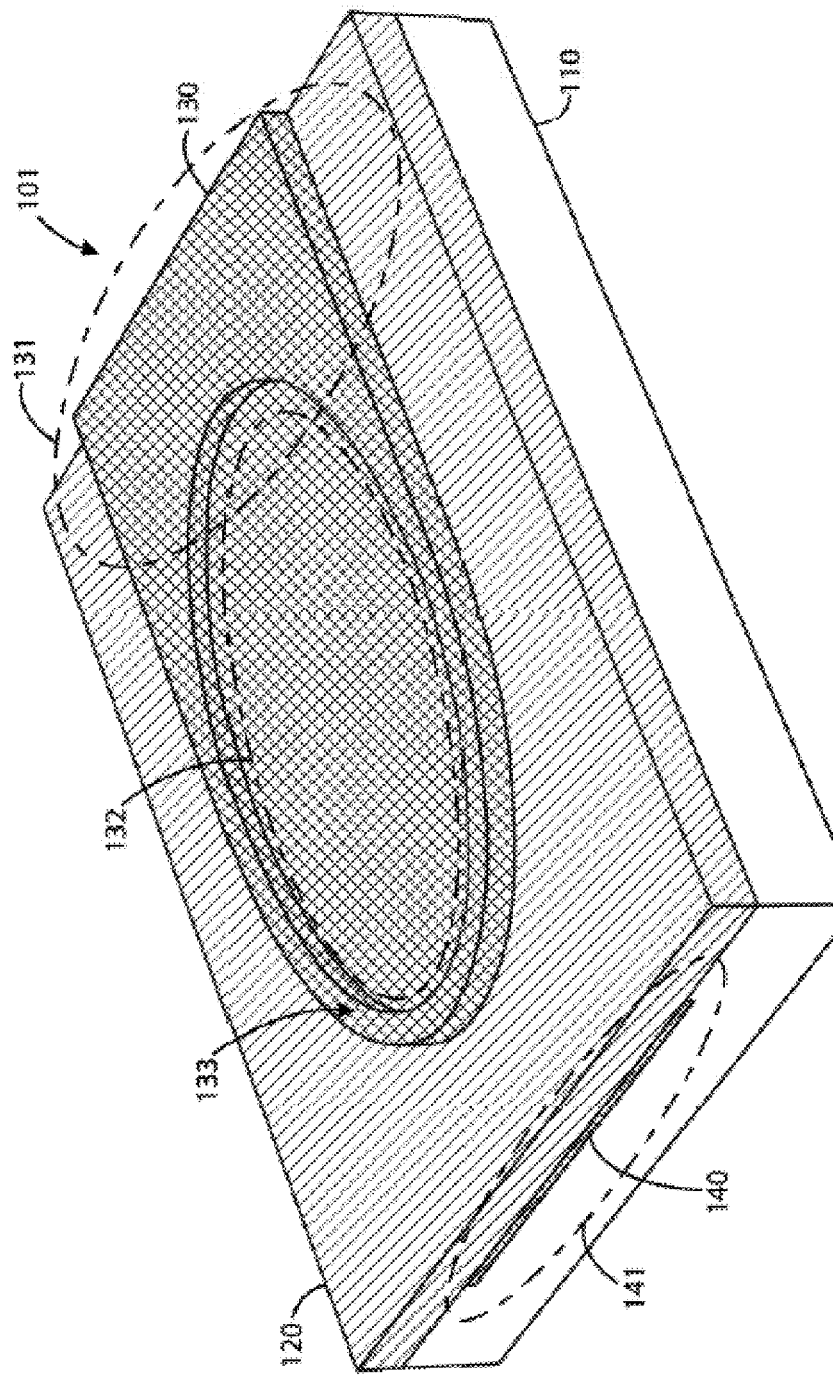
FIG. 1A is simplified diagram illustrating a perspective view of a conventional bulk acoustic wave (BAW) resonator device.

FIG. 1A is a simplified diagram illustrating a perspective view of a conventional BAW resonator. As shown, device 101 includes a piezoelectric layer 120 formed overlying a substrate member 110. A front-side electrode 130 is formed overlying the piezoelectric layer 120, while a back-side electrode 140 is formed underlying the piezoelectric layer 120. Each of the front-side and back-side electrodes includes a connection region 131, 141, respectively, and a resonator region 132 (only front-side electrode resonator region shown).

Here, the front-side electrode 130 has a mass-loaded perimeter 133 via the thicker/raised metal around the perimeter of the electrode shape. This thicker mass-loaded electrode perimeter has higher acoustic impedance compared to the center area of the resonator and provides lower electrical resistance. In contrast, the back-side electrode 140 typically has the same thickness across the connection and resonator areas. The cross-sectional view shown in FIG. 1B highlights the differences between the front-side (130) and back-side (140) electrodes.

Figure 1B:
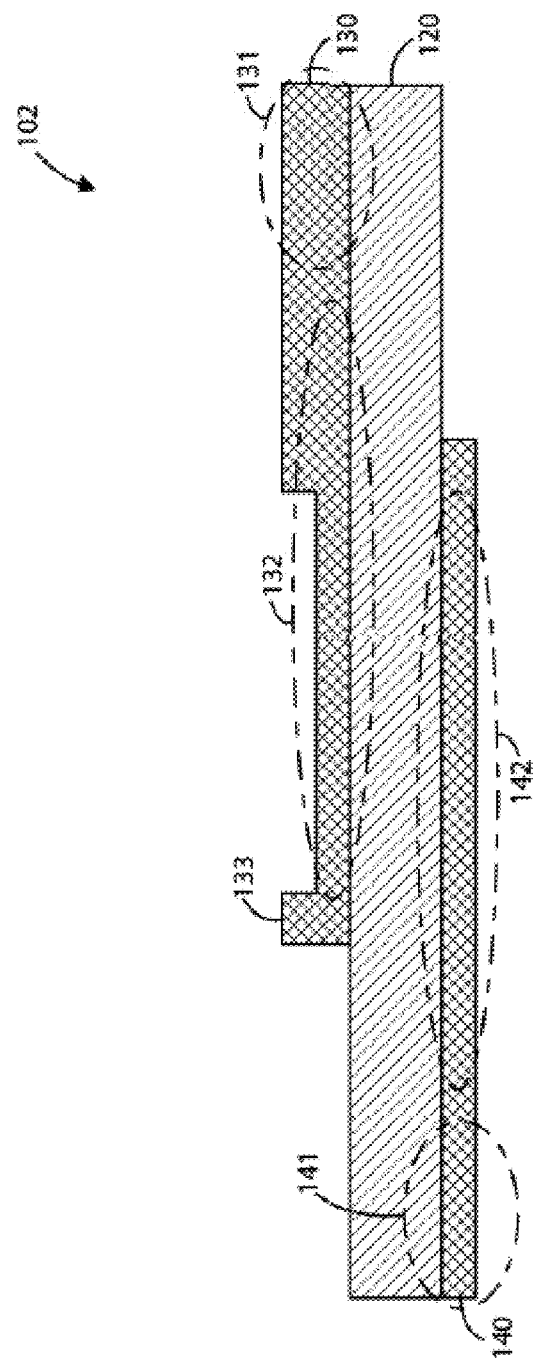
FIG. 1B is a simplified diagram illustrating a cross-sectional view of the conventional BAW resonator of FIG. 1A.

FIG. 1B is a simplified diagram illustrating a cross-sectional view of the conventional BAW resonator of FIG. 1A. Device 102 shows the same components depicted in FIG. 1A from a view that better illustrates the differences between the front-side (130) and back-side (140) electrodes. Here, the front-side electrode 130 has the mass-loaded perimeter 133, which is about the same thickness as the front-side electrode connection region 131. The front-side electrode resonator region 132 is thinner than the rest of the electrode 130. As discussed above, the back-side electrode 140 has roughly the same thickness throughout the connection (141) and resonator (142) regions. In this configuration, the front-side electrode 130 will exhibit lower electrical resistance compared to the back-side electrode 140.

Although this configuration improves the Q factor of the resonator, the acoustic impedance profile on the left side of the resonator as depicted in FIG. 1B is different from the right side. The variation in the acoustic impedance of all the layers forms a step at the left end of the resonator that is defined by the thickness of the electrode in the connection region 131. The step in the acoustic impedance profile at the right end of the resonator is defined by the thickness of the back-side electrode 140 that is significantly smaller than the left end. This asymmetry in the acoustic impedance profile of the mass-loaded perimeter limits the Q improvement. Avoiding the disadvantages of an asymmetric acoustic impedance profile through conventional methods requires complicated structures and difficult processes. Thus, the present invention provides an anti-symmetrical BAW resonator structure and method to achieve improved Q factor with the benefits of a mass-loaded perimeter and lower electrical resistance, but without the disadvantages of an asymmetric acoustic impedance profile.

Figure 2A:
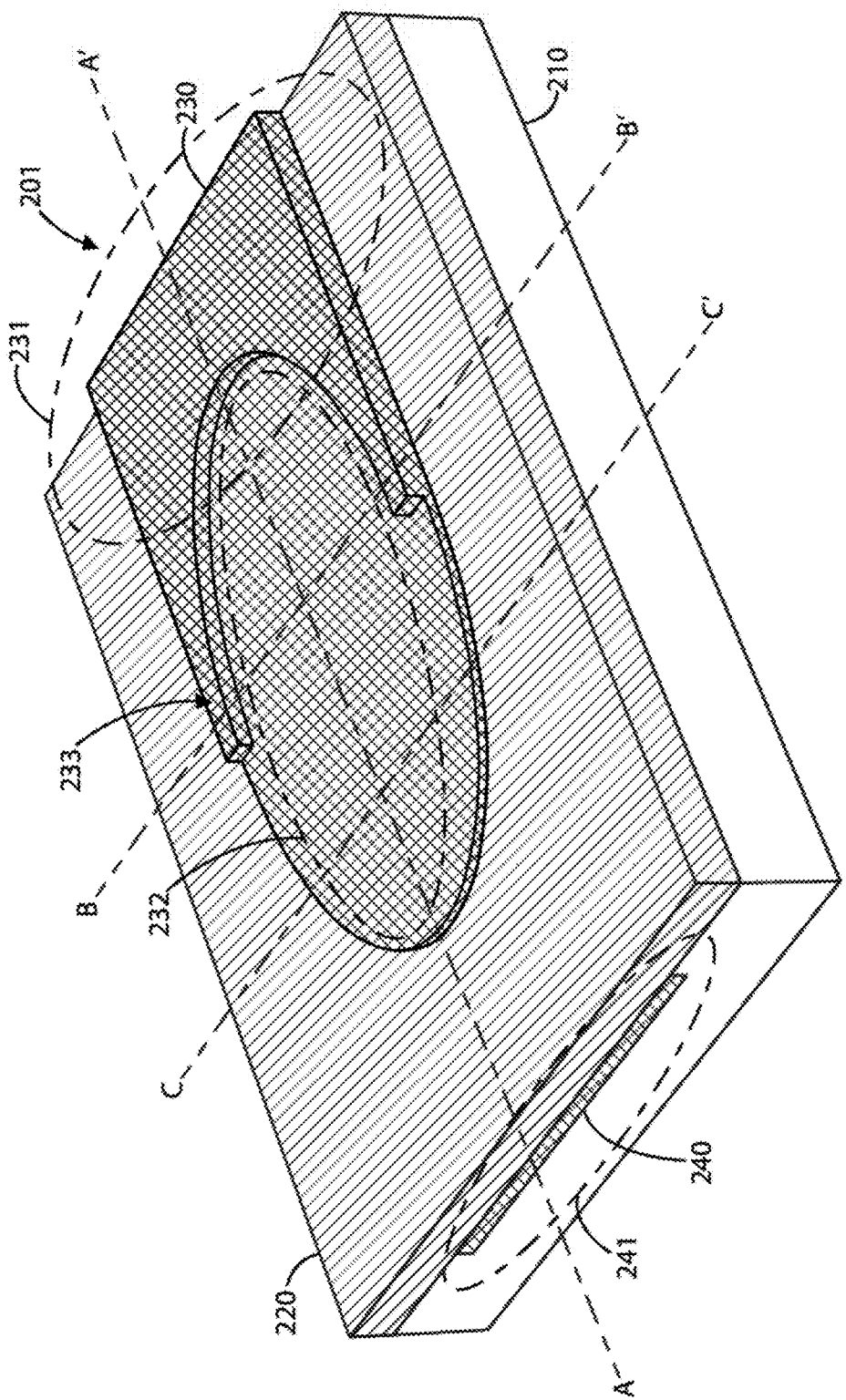
FIG. 2A is a simplified diagram illustrating a perspective top view of a BAW resonator according to an example of the present invention.

FIG. 2A is a simplified diagram illustrating a perspective view of a BAW resonator device according to an example of the present invention. As shown, the device 201 includes a piezoelectric layer 220 formed overlying a substrate member 210. A front-side electrode 230 is formed overlying the piezoelectric layer 220, while a back-side electrode 240 is formed underlying the piezoelectric layer 220. Each of the front-side and back-side electrodes includes a connection region 231, 241, respectively, and a resonator region 232 (only front-side electrode resonator region shown). In an example, the piezoelectric layer can be single-crystalline or polycrystalline AN, AlScN, AlGaN, AlScYN, LiNdO$_3$, LiTaO$_3$, Ba(Sr,Ti)O$_3$, Pb(Zr,Ti)O$_3$, and other related materials. In an example, the electrodes can be molybdenum (Mo), ruthenium (Ru), tungsten (W), aluminum-copper (AlCu) or other like materials.

Here, the front-side electrode 230 has a partially mass-loaded perimeter 233 via the thicker/raised metal around the back end perimeter of the electrode shape near the connection region 231. This partial mass-loaded electrode perimeter has higher acoustic impedance compared to the center area of the resonator and provides lower electrical resistance compared to an electrode without mass-loading. Different from the resonator of FIGS. 1A and 1B, the back-side electrode 240 has a similar structure (shown in FIG. 2B) to the front-side electrode 230 but arranged in an anti-symmetrical fashion. Device 201 also includes cross-section lines A-A', B-B', and C-C', which reference the cross-sectional views shown in FIGS. 2C, 2D, and 2E, respectively. These reference numbers persist through FIGS. 2B-2E to reference the same components or regions.

In an example, the partial mass-loading of the electrodes is achieved by a thicker metal configured only near the connection region of the electrode. In other examples, the mass-loading can be done with other additional materials formed overlying the electrode surface. In a specific example, the thicker perimeter portion can extend to about half of the resonator while the other half of the resonator is formed at the regular thickness that characterizes the resonator regions of the electrodes. These similarly shaped electrodes are spatially configured in an opposite orientation on opposite sides of the piezoelectric layer (i.e., anti-symmetrical configuration). In this configuration, the partial mass-loading provides lower electrical resistance on both the front and back-side electrodes. Those of ordinary skill in the art will recognize other variations, modifications, and alternatives.

Figure 2B:
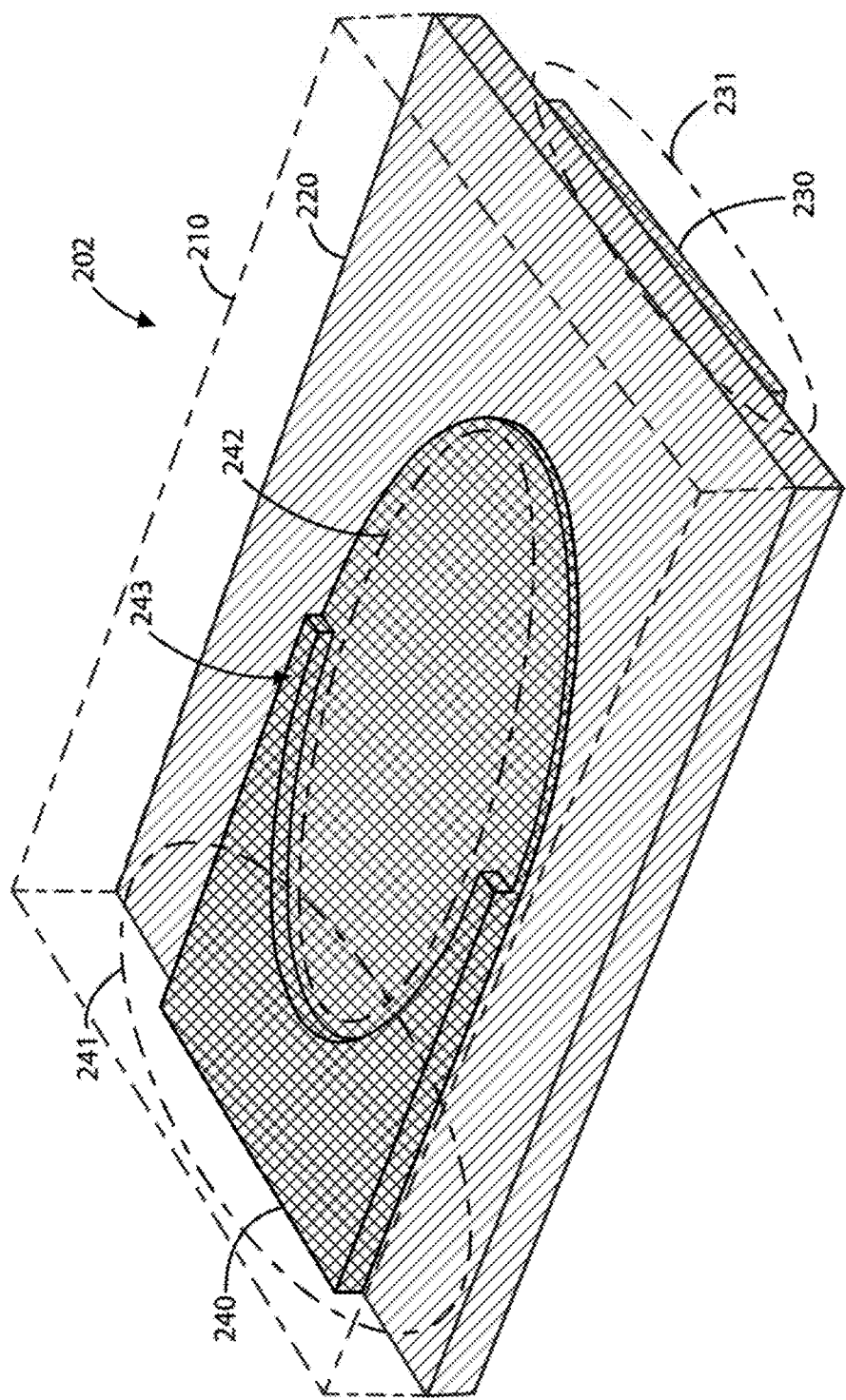
FIG. 2B is a simplified diagram illustrating a perspective bottom view of a BAW resonator according to the example of the present invention shown in FIG. 2A.

FIG. 2B is a simplified diagram illustrating a perspective bottom view of a BAW resonator according to the example of the present invention shown in FIG. 2A. As shown, device 202 is a simplified and rotated version of device 201 with the substrate 210 shown in dotted lines to reveal the back-side electrode 240, which also includes the partial mass-loaded perimeter 243. From this view, the back-side connection region 241 and resonator region 242 are shown more clearly. By comparison to FIG. 2A, it can be seen that both front and back-side electrodes exhibit a similar structure with partial mass-loading towards the connection region. In a specific example, this partial mass-loading takes the form of a thicker metal around the half-perimeter closer to the connection region side with the other half having a regular thickness similar the resonator region of the electrode.

Figure 2C:
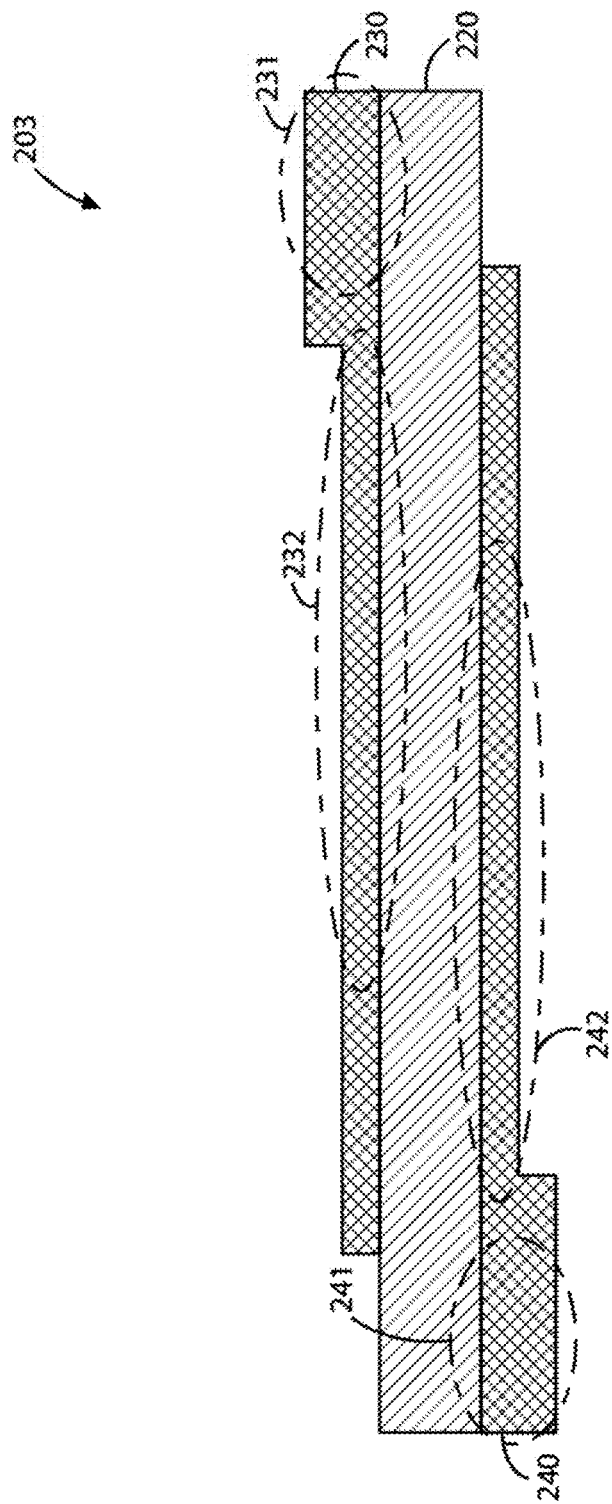
FIG. 2C is a simplified diagram illustrating a cross-sectional view of a BAW resonator according to the example of the present invention shown in FIG. 2A along line A-A'.

FIG. 2C is a simplified diagram illustrating a cross-sectional view of a BAW resonator according to the example of the present invention shown in FIG. 2A along line A-A'. As shown, device 203 includes the front-side electrode 230 and the back-side electrode 240 spatially configured on opposite sides of the piezoelectric layer 220. From this view, it can be seen that both electrodes feature a partial mass-loaded perimeter (i.e., thicker material or combination of materials) near each respective connection region (231, 241) and are arranged in an anti-symmetrical configuration.

In an example, the mass-loaded (i.e. thicker) regions of each electrode partially overlap with the non-mass-loaded regions of the opposing electrode. Configured together, the front-side and back-side electrodes with partial mass-loading effectively form a full mass-loaded perimeter that limits the dissipation of acoustic waves in the resonator. In this overlapped configuration, the acoustic impedance profile exhibits a symmetric shape all around the resonator, which improves the acoustic wave confinement inside the resonator and leads to higher Q factor, especially around the anti-resonance frequency. As discussed previously, the mass-loaded portions lower electrical resistance, which leads to a high Q factor around the resonance frequency. Of course, there can be other variations, modifications, and alternatives.

Figure 2D:
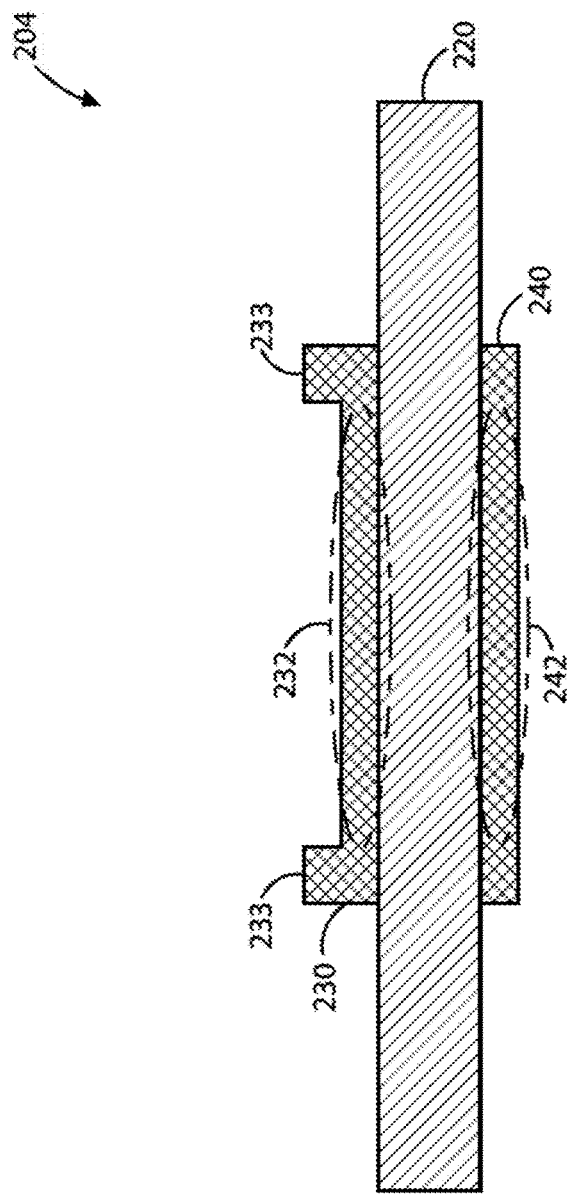
FIG. 2D is a simplified diagram illustrating a cross-sectional view of a BAW resonator according to the example of the present invention shown in FIG. 2A along line B-B'.

FIG. 2D is a simplified diagram illustrating a cross-sectional view of a BAW resonator according to the example of the present invention shown in FIG. 2A along line B-B'. Similar to device 203, device 204 includes the front-side electrode 230 and the back-side 240 spatially configured on opposite sides of the piezoelectric layer 220. From this view, the partial mass-loaded perimeter 233 of the front-side electrode 230 is apparent while the corresponding region of the back-side electrode 240 lacks the partial mass-loading.

Figure 2E:
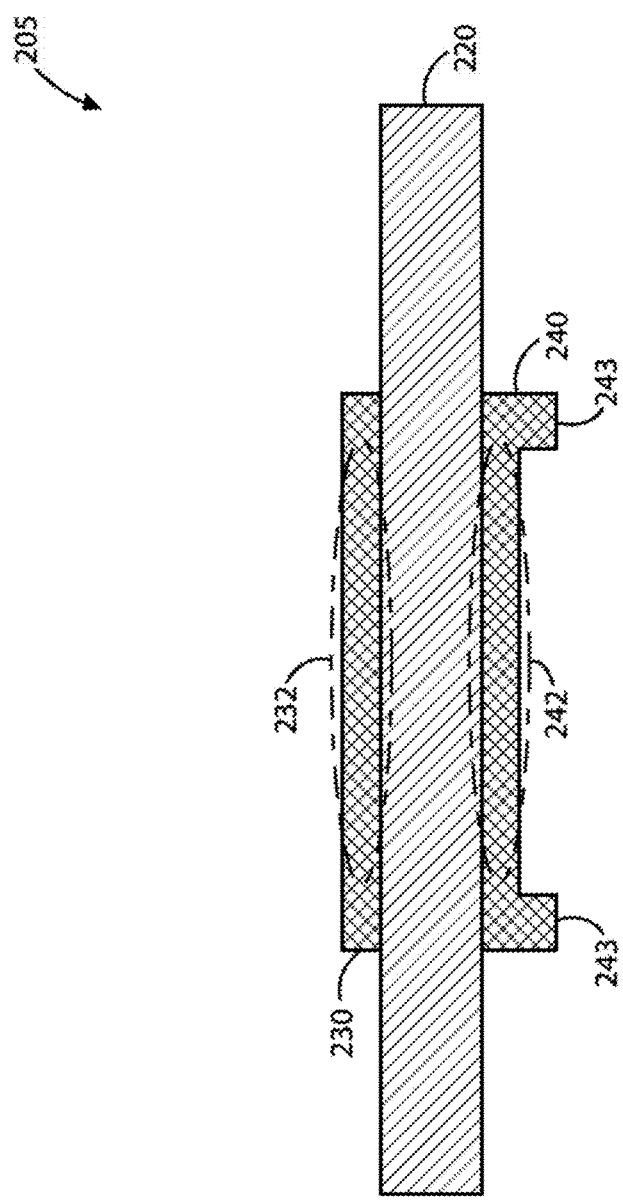
FIG. 2E is a simplified diagram illustrating a cross-sectional view of a BAW resonator according to the example of the present invention shown in FIG. 2A along line C-C'.

FIG. 2E is a simplified diagram illustrating a cross-sectional view of a BAW resonator according to the example of the present invention shown in FIG. 2A along line C-C'. Similar to the previous devices, device 205 includes the front-side electrode 230 and the back-side 240 spatially configured on opposite sides of the piezoelectric layer 220. From this view, the partial mass-loaded perimeter 243 of the back-side electrode 240 is apparent while the corresponding region of the front-side electrode 230 lacks the partial mass-loading.

Figure 3:
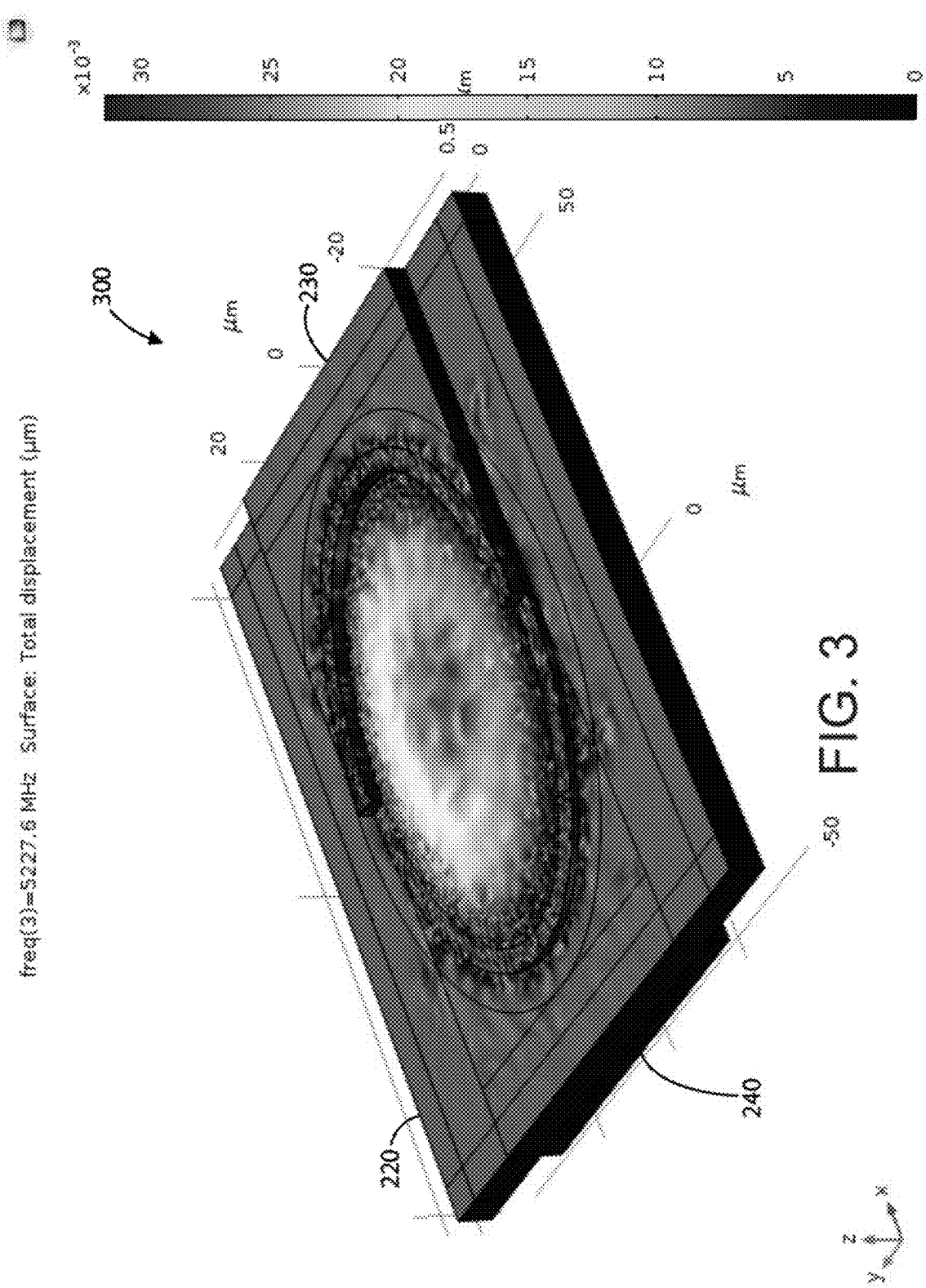
FIG. 3 is a simplified diagram illustrating a perspective top view of a BAW resonator to show surface displacement according to the example of the present invention.

FIG. 3 is a simplified diagram illustrating a perspective top view of a BAW resonator to show surface displacement according to the example of the present invention. As shown, device 300 is similar to device 201, with a front-side electrode 230 and a back-side electrode 240 spatially configured on opposite sides of a piezoelectric layer 220. Here, the displacement (shown by the gradient radiating from the resonator region of the electrodes) at resonance frequency shows that the anti-symmetric thick electrode configuration provides an ideal mass-loaded perimeter with reduced acoustic wave amplitude in the mass loaded region and with reduced lateral mode amplitude on the resonator.

Figure 4:
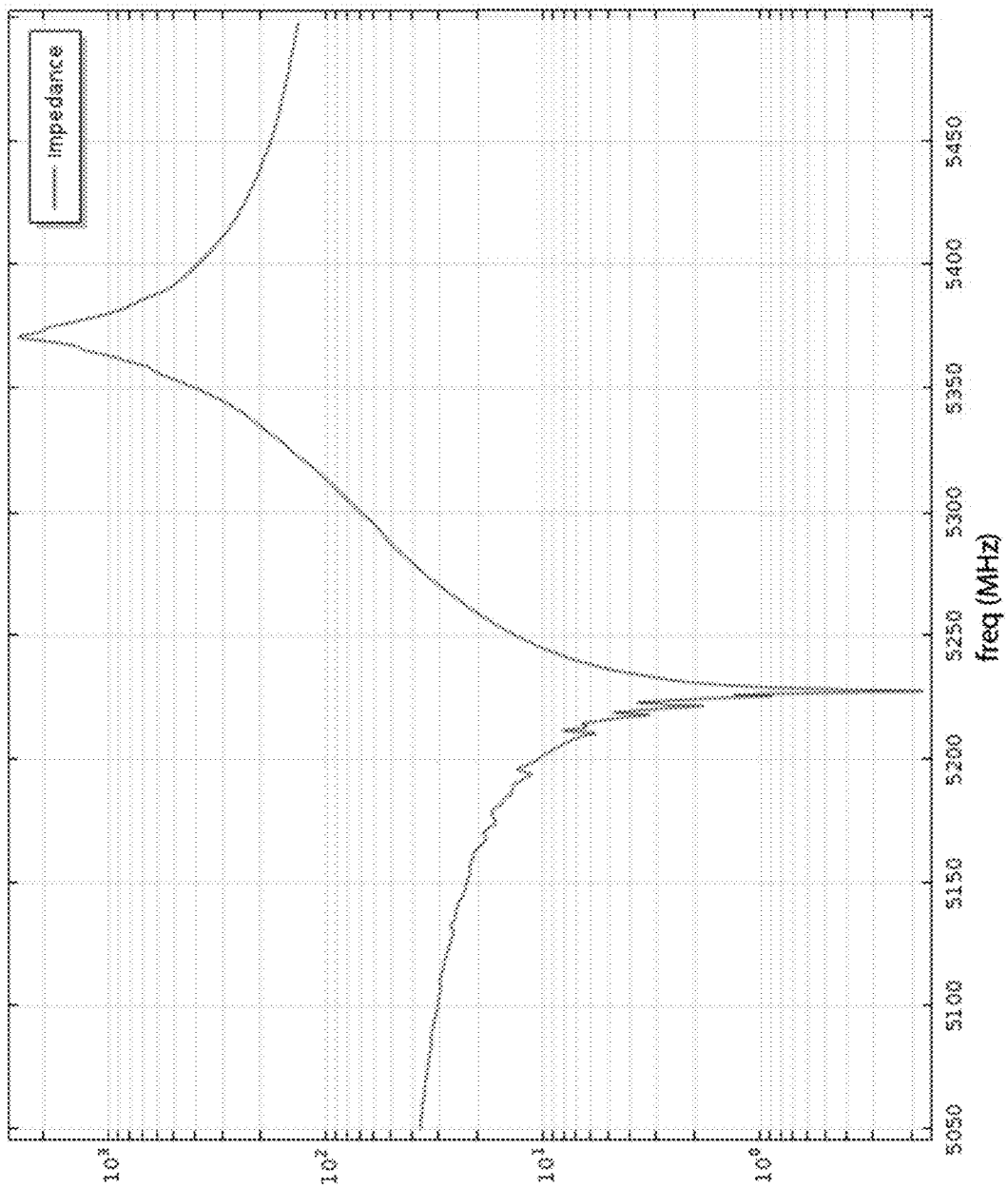
FIG. 4 is a COMSOL simulation plot illustrating the impedance performance of a resonator according to an example of the present invention.

FIG. 4 is a COMSOL simulation plot illustrating the impedance performance of a resonator according to an example of the present invention. This graph shows impedance measured in Ohms over frequency measured in Mega-Hertz. These results show that an anti-symmetrical BAW resonator with partial mass-loaded perimeter electrodes can achieve high electrode polarization resistance ($R_p$) comparable a conventional BAW resonator (shown in FIG. 1A/1B) while having a symmetric acoustic impedance profile.

Figure 5:
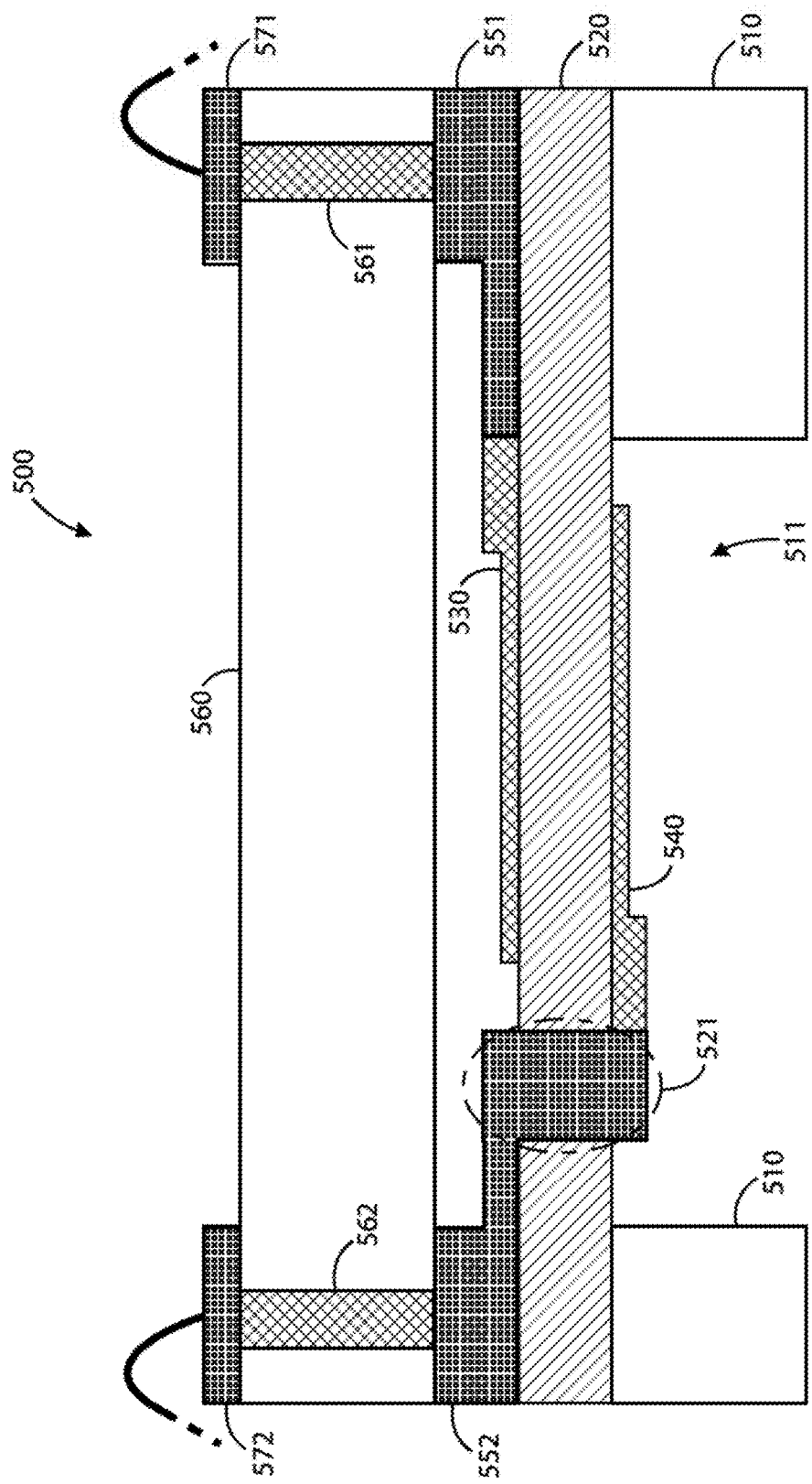
FIG. 5 is a simplified diagram illustrating a cross-sectional view of an RF filter circuit device according to the example of the present invention.

FIG. 5 is a simplified diagram illustrating a cross-sectional view of an RF filter circuit device according to an example of the present invention. As shown, device 500 includes a resonator device having a piezoelectric layer 520 formed overlying a substrate 510. This resonator device includes a front-side electrode 530 and a back-side electrode 540 coupled to the top and bottom surface regions of the piezoelectric layer 520, respectively. Each of these electrodes has a similar partial mass-loaded structure and both electrodes are configured in an anti-symmetrical manner, as described in FIGS. 2A-2E, overlying a cavity region 511 of the substrate 510.

In an example, the front-side and back-side electrodes can include molybdenum (Mo), ruthenium (Ru), tungsten (W), aluminum-copper (AlCu), or other like materials. The partial-mass loaded structures can also include molybdenum (Mo), ruthenium (Ru), tungsten (W), aluminum-copper (AlCu), or other like materials. The partial-mass loaded structure is formed as part of the electrode or separate materials in the fabrication process. Further, the piezoelectric layer can include materials or alloys having at least one of MN, AlGaN, GaN, ScAlN, $LiNbO_3$, $LiTaO_3$, $Ba(Sr,Ti)O_3$, and $Pb(Zr,Ti)O_3$, or the like.

As discussed for FIGS. 2A-2E, each of the electrodes can have a connection region and a resonator region. In a specific example, the front-side and back-side electrodes are spatially configured such that a portion of the front-side electrode partial mass-loaded structure overlaps a portion of the back-side electrode resonator region. Similarly, a portion of the back-side electrode partial mass-loaded structure is overlapped by a portion of the front-side electrode resonator region. Also, these mass-loaded structures can be configured up to around half of the perimeter of the electrodes from the connection region side. Those of ordinary skill in the art will recognize other variations, modifications, and alternatives.

Device 500 further shows an example of the resonator device electrical connections and packaging configuration. The front-side electrode 530 can be electrically coupled by metallization to a first bond pad 551. The piezoelectric layer 520 can have a metal micro-via configured through a portion that is electrically coupled to the back-side electrode 540 and a second bond pad 552.

In an example, device 500 can further include a cap layer 560 formed overlying the resonator device. The cap layer 560 can have vias 561, 562 that are electrically coupled to the first and second bond pads 551, 552, respectively. These vias 561, 562 can also be electrically coupled to cap bond pads 571, 572, which can be connected to other circuit components by wire bonding, solder bonding, or the like. In a specific example, the micro-via can include gold, aluminum, copper, or other like materials. The cap layer can also include a transfer substrate, a glass substrate, a silicon substrate, a sapphire ($Al_2O_3$) substrate, an interposer substrate, or the like. Of course, there can be other variations, modifications, and alternatives.

One or more benefits are achieved over pre-existing techniques using the present invention. In particular, the present invention also provides for an improved anti-symmetrical BAW resonator device and method. The anti-symmetric configuration provides a symmetric acoustic impedance profile for improved Q factor and can reduce the issues of misalignment or unbalanced boundary conditions associated with conventional single mass-loaded perimeter configurations. This configuration also provides lower electrical resistance for improved Q factor around the resonance frequency. Also, the present invention is compatible with arbitrary resonator shapes. Further, the present device can be manufactured in a relatively simple and cost effective manner while using conventional materials and/or methods according to one of ordinary skill in the art. Depending upon the embodiment, one or more of these benefits may be achieved.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A method of manufacturing a resonator circuit device, the method comprising:
    forming a piezoelectric layer;
    forming a front-side electrode formed overlying the piezoelectric layer, the front-side electrode having a first connection region and a first resonator region, the front-side electrode having a first partial mass-loaded structure configured within a vicinity of the first connection region; and
    forming a back-side electrode formed underlying the piezoelectric layer, the back-side electrode having a second connection region and a second resonator region, the back-side electrode having a second partial mass-loaded structure configured within a vicinity of the second connection region;
    wherein the front-side electrode and the back-side electrode are spatially configured in an anti-symmetrical manner with the first and second resonator regions at least partially overlapping and the first and second connection regions on opposing sides.

2. The method of claim 1 wherein the front-side electrode and back-side electrode include molybdenum (Mo), ruthenium (Ru), tungsten (W), or aluminum-copper (AlCu).

3. The device of claim 2 wherein the first and second partial mass-loaded structures include molybdenum (Mo), ruthenium (Ru), tungsten (W), or aluminum-copper (AlCu).

4. The method of claim 1 wherein the front-side and back-side electrodes are spatially configured such that a portion of the first partial mass-loaded structure overlaps a portion of the second resonator region and a portion of the first resonator region overlaps a portion of the second partial mass-loaded structure.

5. The method of claim 1 wherein the first partial mass-loaded structure is spatially configured around about half of a perimeter of the front-side electrode on the side of the first connection region, and wherein the second partial mass-loaded structure is spatially configured around about half of a perimeter of the back-side electrode on the side of the second connection region.

6. The method of claim 1 wherein the piezoelectric layer includes materials or alloys having at least one of the following: AlN, AlGaN, GaN, ScAlN, $LiNbO_3$, $LiTaO_3$, $Ba(Sr,Ti)O_3$, and $Pb(Zr,Ti)O_3$.

7. A method of manufacturing a resonator circuit device, the method comprising:
    forming a piezoelectric layer;
    forming a front-side electrode formed overlying the piezoelectric layer, the front-side electrode having a first connection region and a first resonator region, the front-side electrode having a first thicker portion within a vicinity of the first connection region; and
    forming a back-side electrode formed underlying the piezoelectric layer, the back-side electrode having a second connection region and a second resonator region, the back-side electrode having a second thicker portion within a vicinity of the second connection region;
    wherein the front-side electrode and the back-side electrode are spatially configured in an anti-symmetrical manner with the first and second resonator regions at least partially overlapping and the first and second connection regions on opposing sides.

8. The method of claim 7 wherein the front-side electrode and back-side electrode include molybdenum (Mo), ruthenium (Ru), tungsten (W), or aluminum-copper (AlCu).

9. The method of claim 7 wherein the front-side and back-side electrodes are spatially configured such that a portion of the first thicker portion overlaps a portion of the second resonator region and a portion of the second thicker portion overlaps a portion of the first resonator region.

10. The method of claim 7 wherein the first thicker portion is spatially configured around about half of a perimeter of the front-side electrode on the side of the first connection region, and wherein the second thicker portion is spatially configured around about half of a perimeter of the back-side electrode on the side of the second connection region.

11. The method of claim 7 wherein the piezoelectric layer includes materials or alloys having at least one of the following: AlN, AlGaN, GaN, ScAlN, $LiNbO_3$, $LiTaO_3$, $Ba(Sr,Ti)O_3$, and $Pb(Zr,Ti)O_3$.

12. A method of manufacturing an RF filter circuit device, the method comprising:

forming a substrate member having a cavity region;

forming a piezoelectric layer formed overlying the substrate member;

forming a front-side electrode formed overlying the piezoelectric layer, the front-side electrode having a first connection region and a first resonator region, the front-side electrode having a first partial mass-loaded structure configured within a vicinity of the first connection region;

forming a back-side electrode formed underlying the piezoelectric layer within the cavity region, the back-side electrode having a second connection region and a second resonator region, the back-side electrode having a second partial mass-loaded structure configured within a vicinity of the second connection region;

wherein the front-side electrode and the back-side electrode are spatially configured in an anti-symmetrical manner with the first and second resonator regions at least partially overlapping and the first and second connection regions on opposing sides;

forming a micro-via configured through a portion of the piezoelectric layer, the micro-via being electrically coupled to the back-side electrode at the second connection region;

forming a first bond pad electrically coupled to the front-side electrode at the first connection region; and forming a second bond pad electrically coupled to the back-side electrode through the micro-via.

13. The method of claim 12 wherein the front-side electrode and back-side electrode include molybdenum (Mo), ruthenium (Ru), tungsten (W), or aluminum-copper (AlCu).

14. The method of claim 13 wherein the first and second partial mass-loaded structures include molybdenum (Mo), ruthenium (Ru), tungsten (W), or aluminum-copper (AlCu).

15. The method of claim 12 wherein the front-side and back-side electrodes are spatially configured such that a portion of the first partial mass-loaded structure overlaps a portion of the second resonator region and a portion of the second partial mass-loaded structure overlaps a portion of the first resonator region.

16. The method of claim 12 wherein the first partial mass-loaded structure is spatially configured around about half of a perimeter of the front-side electrode on the side of the first connection region, and wherein the second partial mass-loaded structure is spatially configured around about half of a perimeter of the back-side electrode on the side of the second connection region.

17. The method of claim 12 wherein the piezoelectric layer includes materials or alloys having at least one of the following: AlN, AlGaN, GaN, ScAlN, $LiNbO_3$, $LiTaO_3$, $Ba(Sr,Ti)O_3$, and $Pb(Zr,Ti)O_3$.

18. The method of claim 12 wherein the micro-via includes gold, aluminum, or copper.

19. The method of claim 12 further comprising forming a cap layer overlying the front-side electrode, the piezoelectric layer, the back-side electrode, and the substrate member; wherein the cap layer includes a transfer substrate, a glass substrate, a silicon substrate, a sapphire ($Al_2O_3$) substrate, or an interposer substrate.

20. The method of claim 19 wherein forming the cap layer includes forming a first cap via through a portion of the cap layer and electrically coupled to the first bond pad;

forming a second cap via electrically coupled to the second bond pad;

forming a first cap bond pad overlying the cap layer and electrically coupled to the first cap via; and forming a second cap bond pad overlying the cap layer and electrically coupled to the second cap via.

* * * * *